US012666759B2

(12) United States Patent
Soer et al.

(10) Patent No.: US 12,666,759 B2
(45) Date of Patent: Jun. 23, 2026

(54) TUNNEL-JUNCTION CASCADE LED WITH DIFFERENT PUMP WAVELENGTHS

(71) Applicant: Lumileds LLC, San Jose, CA (US)

(72) Inventors: Wouter Anthon Soer, Utrecht (NL);
Johannes Willem Herman Sillevis Smitt, San Jose, CA (US)

(73) Assignee: LUMILEDS SINGAPORE PTE. LTD., Singapore (SG)

( * ) Notice: Subject to any disclaimer, the term of this patent is extended or adjusted under 35 U.S.C. 154(b) by 381 days.

(21) Appl. No.: 18/385,551

(22) Filed: Oct. 31, 2023

(65) Prior Publication Data

US 2025/0143017 A1     May 1, 2025

(51) Int. Cl.
*H10H 20/813* (2025.01)
*H10H 20/01* (2025.01)
*H10H 20/812* (2025.01)
*H10H 20/825* (2025.01)
*H10H 20/851* (2025.01)

(52) U.S. Cl.
CPC .......... *H10H 20/813* (2025.01); *H10H 20/01* (2025.01); *H10H 20/0133* (2025.01); *H10H 20/812* (2025.01); *H10H 20/825* (2025.01); *H10H 20/8512* (2025.01); *H10H 20/032* (2025.01); *H10H 20/0361* (2025.01)

(58) Field of Classification Search
CPC ... H10H 20/813; H10H 20/0133; H10H 20/01
See application file for complete search history.

(56) References Cited

U.S. PATENT DOCUMENTS 6,410,942 B1    6/2002    Thibeault et al.
6,657,236 B1    12/2003    Thibeault et al.

6,821,804 B2    11/2004    Thibeault et al.
6,822,991 B2 *  11/2004    Collins, III ............ H10H 29/10
                                                257/E33.044
8,222,811 B2    7/2012    Vaufrey et al.
8,258,044 B2    9/2012    Brun et al.
8,487,340 B2    7/2013    Gilet et al.
8,604,702 B2    12/2013    Bertram
(Continued)

FOREIGN PATENT DOCUMENTS

DE    102010051286 A1    5/2012
DE    102012109460 A1    4/2014
DE    102014112551 A1    3/2016
EP       1378949 A1     1/2004
EP       2027608 A1     2/2009
EP       2203939 A1     7/2010
EP       2211387 A2     7/2010
EP       2339658 A2     6/2011
(Continued)

OTHER PUBLICATIONS

PCT International Search Report and Written Opinion in PCT/US2024/052904 dated Jan. 29, 2025, 15 pages.
(Continued)

*Primary Examiner* — Errol V Fernandes

(74) *Attorney, Agent, or Firm* — Servilla Whitney LLC

(57)     ABSTRACT

Provided is a phosphor converted LED comprised of a first and a second p-n junction deposited sequentially on the same wafer. The first and second junctions are separated by a tunnel junction. One multiple quantum well is embedded between the n- and p-layers of the first junction and another multiple quantum well is embedded between the n- and p-layers of the second junction. The peak emission wavelengths of the two junctions are both between 400 nm and 500 nm and are at least 5 nm apart.

22 Claims, 5 Drawing Sheets

(56) References Cited

U.S. PATENT DOCUMENTS

| | | | |
|---|---|---|---|
| 8,638,032 B2 | 1/2014 | Maindron et al. |
| 8,647,957 B2 | 2/2014 | Borowik et al. |
| 8,697,548 B2 | 4/2014 | Borowik et al. |
| 8,698,396 B2 | 4/2014 | Maindron et al. |
| 8,890,111 B2 | 11/2014 | Templier et al. |
| 9,093,607 B2 | 7/2015 | Gilet et al. |
| 9,109,296 B2 | 8/2015 | Metaye et al. |
| 9,112,112 B2 | 8/2015 | Do et al. |
| 9,192,290 B2 | 11/2015 | Spinnler et al. |
| 9,209,366 B2 | 12/2015 | Maindron et al. |
| 9,263,633 B2 | 2/2016 | Gilet et al. |
| 9,396,970 B2 | 7/2016 | Gillot et al. |
| 9,422,628 B2 | 8/2016 | Simonato et al. |
| 9,496,465 B2 | 11/2016 | Sugimoto et al. |
| 9,507,204 B2 | 11/2016 | Pelka et al. |
| 9,560,714 B1 | 1/2017 | Hjerde |
| 9,601,542 B2 | 3/2017 | Robin et al. |
| 9,722,160 B2 | 8/2017 | Nakabayashi |
| 9,768,350 B2 | 9/2017 | Bavencove et al. |
| 9,887,184 B2 | 2/2018 | Takeya et al. |
| 9,890,911 B2 | 2/2018 | Soer et al. |
| 9,945,526 B2 | 4/2018 | Singer et al. |
| 9,978,727 B2 | 5/2018 | Takeya et al. |
| 9,997,688 B2 | 6/2018 | Takeya et al. |
| 10,002,928 B1 | 6/2018 | Raring et al. |
| 10,018,325 B2 | 7/2018 | Kim et al. |
| 10,050,026 B2 | 8/2018 | Takeya et al. |
| 10,068,884 B2 | 9/2018 | Takeya et al. |
| 10,145,518 B2 | 12/2018 | Do et al. |
| 10,964,845 B2 | 3/2021 | Dimitropoulos et al. |
| 2004/0066816 A1 | 4/2004 | Collins, III et al. |
| 2005/0067627 A1 | 3/2005 | Shen et al. |
| 2011/0151607 A1 | 6/2011 | Landis et al. |
| 2011/0287606 A1 | 11/2011 | Brun et al. |
| 2012/0205614 A1 | 8/2012 | Templier et al. |
| 2013/0020115 A1 | 1/2013 | Mataye et al. |
| 2013/0112945 A1 | 5/2013 | Gilet et al. |
| 2014/0077156 A1 | 3/2014 | Bavencove et al. |
| 2014/0094878 A1 | 4/2014 | Gossler et al. |
| 2014/0138719 A1 | 5/2014 | Maindron et al. |
| 2015/0118544 A1 | 4/2015 | Oukassi |
| 2015/0144590 A1 | 5/2015 | Simonato et al. |
| 2015/0228873 A1 | 8/2015 | Gebuhr et al. |
| 2015/0280060 A1 | 10/2015 | Gilet et al. |
| 2015/0380461 A1 | 12/2015 | Robin et al. |
| 2016/0079565 A1 | 3/2016 | Maindron et al. |
| 2016/0190400 A1 | 6/2016 | Jung et al. |
| 2016/0218240 A1 | 7/2016 | Bouvier et al. |
| 2016/0293811 A1 | 10/2016 | Hussell et al. |
| 2017/0018679 A1 | 1/2017 | Lee |
| 2017/0080457 A1 | 3/2017 | Eymery et al. |
| 2017/0098746 A1 | 4/2017 | Bergmann et al. |
| 2017/0137645 A1 | 5/2017 | Manceau et al. |
| 2017/0186612 A1 | 6/2017 | Almadori et al. |
| 2017/0243860 A1 | 8/2017 | Hong et al. |
| 2017/0293065 A1 | 10/2017 | Kim |
| 2017/0358563 A1 | 12/2017 | Cho et al. |
| 2017/0358724 A1 | 12/2017 | Shichijo et al. |
| 2018/0017939 A1 | 1/2018 | Allier et al. |
| 2018/0019369 A1 | 1/2018 | Cho et al. |
| 2018/0019373 A1 | 1/2018 | Lehnhardt et al. |
| 2018/0061316 A1 | 3/2018 | Shin et al. |
| 2018/0074372 A1 | 3/2018 | Takeya et al. |
| 2018/0090540 A1 | 3/2018 | Von Malm et al. |
| 2018/0138157 A1 | 5/2018 | Im et al. |
| 2018/0145059 A1 | 5/2018 | Welch et al. |
| 2018/0149328 A1 | 5/2018 | Cho et al. |
| 2018/0156406 A1 | 6/2018 | Feil et al. |
| 2018/0166470 A1 | 6/2018 | Chae |
| 2018/0174519 A1 | 6/2018 | Kim et al. |
| 2018/0174931 A1 | 6/2018 | Henley |
| 2018/0210282 A1 | 7/2018 | Song et al. |
| 2018/0238511 A1 | 8/2018 | Hartmann et al. |
| 2018/0259137 A1 | 9/2018 | Lee et al. |
| 2018/0259570 A1 | 9/2018 | Henley |
| 2018/0272605 A1 | 9/2018 | Gmeinsieser et al. |
| 2018/0283642 A1 | 10/2018 | Liao et al. |
| 2018/0297510 A1 | 10/2018 | Fiederling et al. |
| 2018/0339643 A1 | 11/2018 | Kim |
| 2018/0339644 A1 | 11/2018 | Kim |
| 2018/0354406 A1 | 12/2018 | Park |
| 2019/0371976 A1 | 12/2019 | Kessels et al. |
| 2023/0051845 A1 | 2/2023 | Zollner et al. |
| 2025/0133870 A1* | 4/2025 | Zhu ................. H10H 20/01335 |

FOREIGN PATENT DOCUMENTS

| | | | |
|---|---|---|---|
| EP | 2491591 A1 | 8/2012 |
| EP | 2499958 A1 | 9/2012 |
| EP | 2521161 A1 | 11/2012 |
| EP | 2521162 A1 | 11/2012 |
| EP | 2553149 A1 | 2/2013 |
| EP | 2617069 A1 | 7/2013 |
| EP | 2674516 A1 | 12/2013 |
| EP | 2855744 B1 | 5/2016 |
| EP | 3053199 A1 | 8/2016 |
| EP | 3144272 A1 | 3/2017 |
| EP | 2006921 B1 | 12/2018 |
| EP | 3410002 A1 | 12/2018 |
| EP | 3410003 A1 | 12/2018 |
| EP | 2710634 B1 | 10/2020 |
| FR | 2952366 A1 | 5/2011 |
| FR | 2964796 A1 | 3/2012 |
| FR | 2969995 A1 | 7/2012 |
| FR | 2972815 A1 | 9/2012 |
| FR | 2974940 A1 | 11/2012 |
| FR | 2974941 A1 | 11/2012 |
| FR | 2975532 A1 | 11/2012 |
| FR | 2991342 A1 | 12/2013 |
| FR | 2991999 A1 | 12/2013 |
| FR | 2998090 A1 | 5/2014 |
| FR | 3011383 A1 | 4/2015 |
| FR | 3041274 A1 | 3/2017 |
| FR | 3046155 A1 | 6/2017 |
| FR | 3052915 A1 | 12/2017 |
| JP | 2016066765 A | 4/2016 |
| KR | 20140118466 A | 10/2014 |
| KR | 20170018687 A | 2/2017 |
| KR | 20180010670 A | 1/2018 |
| KR | 20180114413 A | 10/2018 |
| TW | 201417339 A | 5/2014 |
| TW | 201602163 A | 6/2016 |
| WO | 2006138465 A2 | 12/2006 |
| WO | 2011045289 A1 | 4/2011 |
| WO | 2011048318 A1 | 4/2011 |
| WO | 2012035243 A1 | 3/2012 |
| WO | 2012156620 A2 | 11/2012 |
| WO | 2013182969 A1 | 12/2013 |
| WO | 2015044620 A1 | 4/2015 |
| WO | 2016079505 A1 | 5/2016 |
| WO | 2017068029 A1 | 4/2017 |
| WO | 2017102708 A1 | 6/2017 |
| WO | 2017184686 A1 | 10/2017 |
| WO | 2017216445 A1 | 12/2017 |
| WO | 2018091657 A1 | 5/2018 |
| WO | 2018139866 A1 | 8/2018 |
| WO | 2018143682 A1 | 8/2018 |
| WO | 2018159977 A1 | 9/2018 |
| WO | 2018169243 A1 | 9/2018 |
| WO | 2019092357 A1 | 5/2019 |
| WO | 2019126539 A1 | 6/2019 |

OTHER PUBLICATIONS

Liu, Zongyuan , et al., "Precise optical modeling of blue light-emitting diodes by Monte Carlo ray-tracing", Optics Express, Apr. 26, 2010, vol. 18, No. 9, pp. 9398-9412.

* cited by examiner

<u>100A</u>

108b

106b

104b

110a

108a

106a

104a

102

105b

105a

100B 108c
106c
104c
110b
108b
106b
104b
110a
108a
106a
104a
102

105c
105b
105a

60

50

52 — Forming Two P-N Junctions Sequentially On The Same Epitaxial Wafer

54 — Dry Etch A Via Into Epitaxial Stack

56 — Conformally Deposit Dielectric Layer Across Wafer

58 — Remove Dielectric Form Contact Openings

60 — Deposit Cathode Metal And Anode Metal

62 — Deposit Bonding Metal Layer

64 — Die Singulation

66 — Bond Die To Sub-Mount

68 — Laser Lift-Off

70 — Deposit Wavelength Converting Layer

TUNNEL-JUNCTION CASCADE LED WITH DIFFERENT PUMP WAVELENGTHS

TECHNICAL FIELD

Embodiments of the disclosure generally relate to arrays of light emitting diode (LED) devices and methods of manufacturing the same. More particularly, embodiments are directed to phosphor converted light emitting diode devices having a first and a second p-n junction deposited sequentially on the same wafer, the first and second junctions separated by a tunnel junction and having different emission wavelengths in the blue range.

BACKGROUND

A light emitting diode (LED) is a semiconductor light source that emits visible light when current flows through it. LEDs combine a P-type semiconductor with an N-type semiconductor. LEDs commonly use a III-group compound semiconductor. A III-group compound semiconductor provides stable operation at a higher temperature than devices that use other semiconductors. The III-group compound is typically formed on a substrate formed of sapphire or silicon carbide (SiC).

Phosphor converted LEDs (pc-LEDs) include a converter layer, e.g., a phosphor layer on an LED pump. The phosphor layer absorbs energy and converts an entering wavelength to a lower-energy wavelength. For example, the phosphor layer down-converts high energy LED light into a more desirable color spectrum. In practice, the phosphor layer composition and structure are chosen to meet desired performance criteria. Reliability is a requirement for pc-LEDs. Demand for pc-LEDs operating at high power levels has been on the rise, which in turn presents a need for pc-LED materials to operate at high temperatures while maintaining good stability.

Phosphor-converted white LEDs commonly feature a blue pump LED with emission around 450 nm and one or more phosphors that down-convert part of this light to longer wavelengths to create a white spectrum. This architecture enables very efficient LEDs for a wide range of application requirements, including high color fidelity where CRI values greater than 90 or 95 can be routinely achieved. For some applications, however, it is desirable to precisely engineer the emission in the blue range beyond what is possible or practical with this architecture.

A typical characteristic of the phosphor-converted white LED is a single blue peak around 450 nm, with relatively little spectral power in the neighboring longer wavelength range between 470 nm to 500 nm, which is sometimes referred to as the cyan gap. The origin of the cyan gap lies in the fact that efficient down-converters inherently have significant separation between their absorption spectrum and emission spectrum.

For some applications, a white spectrum with continuous or even enhanced emission in the blue-cyan range is desired. Such a spectrum may enable ultra-high color fidelity, very specific color rendering characteristics, or a high melanopic content that are not possible with conventional phosphor-converted white LEDs.

Solutions exist to achieve such a spectrum at LED level, but they have significant disadvantages. For example, violet pumped LEDs use a shorter wavelength pump (400-430 nm) combined with a blue phosphor to fill the cyan gap. The main disadvantage of this approach is lower efficiency due to a larger Stokes shift and double down-conversion. Dual pump LEDs use multiple LED die with different emission wavelengths (e.g., 450 nm and 480 nm) in a single package. A disadvantage of this approach is that the die are arranged laterally, leading to color uniformity challenges, and making it generally unsuitable for high-power LED applications requiring a compact single-die package.

Accordingly, there is a need for improved phosphor converted LED devices.

SUMMARY

Embodiments of the disclosure are directed to LED devices and methods for manufacturing LED devices. In one or more embodiments, a light emitting diode (LED) device comprises: a first p-n junction on a second p-n junction, the first p-n junction and the second p-n junction separated by a tunnel junction, wherein the first p-n junction comprises a first p-type layer on a first multiple quantum well, and the first multiple quantum well on a first n-type layer, the second p-n junction comprises a second n-type layer in contact with the tunnel junction and on a second multiple quantum well, the second multiple quantum well on a second p-type layer; a first metal contact on the first n-type layer; a second metal contact on the second p-type layer; and a wavelength converting layer on the first p-n junction and on the second p-n junction.

Additional embodiments of the disclosure are directed to methods of manufacturing LED devices. In one or more embodiments, a method of manufacturing a light-emitting diode (LED) die comprises: epitaxially growing a first p-n junction and a second p-n junction on an epitaxial wafer, the first p-n junction and the second p-n junction separated by a tunnel junction, the first p-n junction comprising a first p-type layer on a first multiple quantum well, and the first multiple quantum well on a first n-type layer, the second p-n junction comprising a second n-type layer in contact with the tunnel junction and on a second multiple quantum well, the second multiple quantum well on a second p-type layer; forming a wavelength converting layer on the first p-n junction and on the second p-n junction; and forming at least one metal contact on one or more of the first n-type layer or the second p-type layer, wherein the first p-n junction has a first emission wavelength in a range of from 400 nm to 500 nm and wherein the second p-n junction has a second emission wavelength in a range of from 400 nm to 500 nm, the first emission wavelength different from the second emission wavelength by at least 5 nm.

Further embodiments of the disclosure are directed to methods of manufacturing think film flip chip (TFFC) die. In one or more embodiments, a method of manufacturing thin film flip chip (TFFC) die comprises: sequentially forming a first p-n junction and a second p-n junction on an epitaxial wafer to form an epitaxial stack, the first p-n junction and the second p-n junction separated by a tunnel junction, the first p-n junction comprising a first p-type layer on a first multiple quantum well, and the first multiple quantum well on a first n-type layer, the second p-n junction comprising a second n-type layer in contact with the tunnel junction and on a second multiple quantum well, the second multiple quantum well on a second p-type layer; forming a wavelength converting layer on the first p-n junction and on the second p-n junction; dry etching the epitaxial stack to form a via; conformally depositing a dielectric layer in the via; removing a portion of the dielectric layer to form contact openings; depositing one or more of an anode layer and a cathode layer in the contact openings; depositing a bonding metal layer on one or more of the anode layer or the cathode layer;

3 singulating the thin film flip chip (TFFC) die; and bonding the thin film flip chip (TFFC) die to a sub-mount.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

To facilitate understanding, identical reference numerals have been used, where possible, to designate identical elements that are common to the figures. The figures are not drawn to scale. For example, the heights and widths of the mesas are not drawn to scale.

DETAILED DESCRIPTION

Figure 1A:
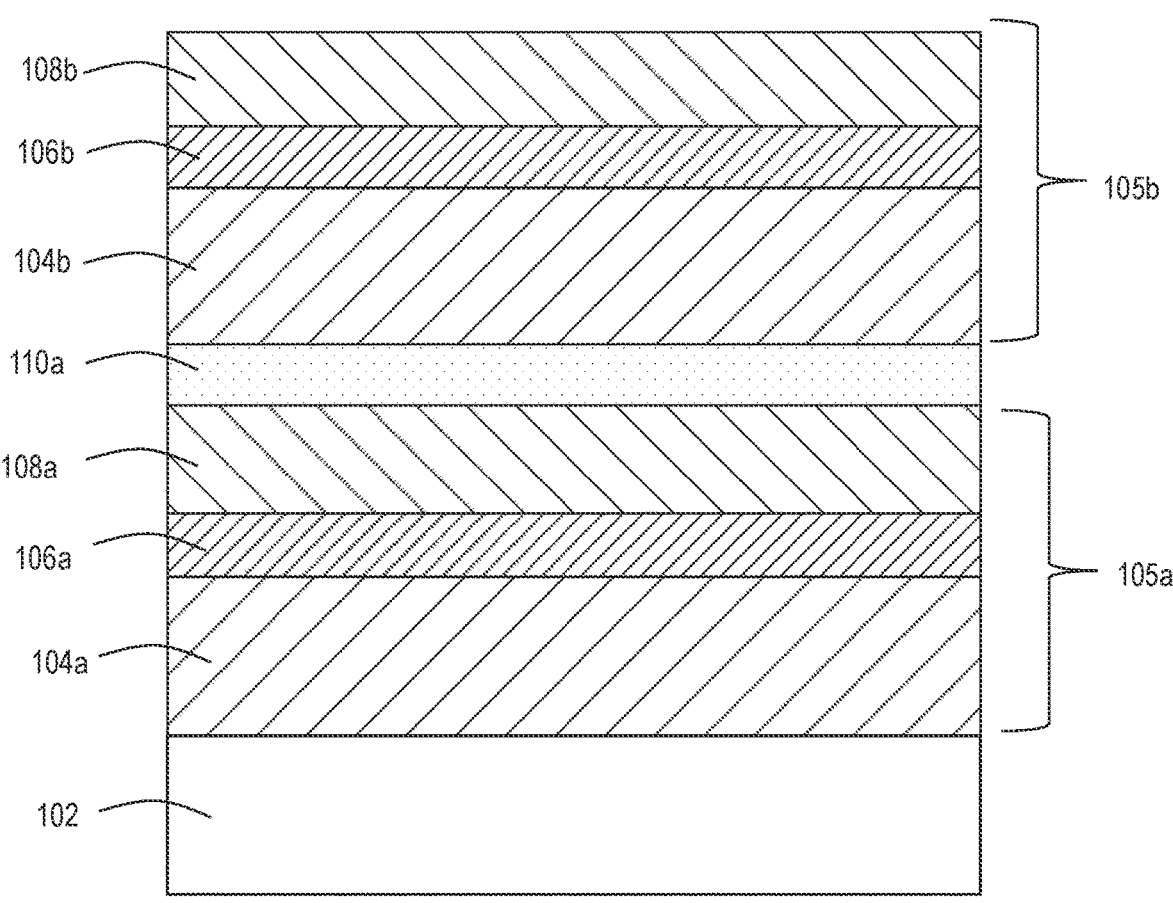
FIG. 1A illustrates a cross-section schematic of an epitaxy configuration according to one or more embodiments.

Before describing several exemplary embodiments of the disclosure, it is to be understood that the disclosure is not limited to the details of construction or process steps set forth in the following description. The disclosure is capable of other embodiments and of being practiced or being carried out in various ways.

The term "substrate" as used herein according to one or more embodiments refers to a structure, intermediate or final, having a surface, or portion of a surface, upon which a process acts. In addition, reference to a substrate in some embodiments also refers to only a portion of the substrate, unless the context clearly indicates otherwise. Further, reference to depositing on a substrate according to some embodiments includes depositing on a bare substrate or on a substrate with one or more layers, films, features, or materials deposited or formed thereon.

In one or more embodiments, the "substrate" means any substrate or material surface formed on a substrate upon which film processing is performed during a fabrication process. A "device substrate" is a substrate of a final product or device. In exemplary embodiments, a substrate surface on which processing is performed includes materials such as silicon, silicon oxide, silicon on insulator (SOI), strained silicon, amorphous silicon, doped silicon, carbon doped silicon oxides, germanium, gallium arsenide, glass, sapphire, and any other suitable materials such as metals, metal nitrides, III-nitrides (e.g., GaN, AlN, InN, and other alloys), metal alloys, and other conductive materials, depending on the application. Substrates include, without limitation, light emitting diode (LED) devices. Substrates in some embodiments are exposed to a pretreatment process to polish, etch, reduce, oxidize, hydroxylate, anneal, UV cure, e-beam cure and/or bake the substrate surface. In addition to film processing directly on the surface of the substrate itself, in some embodiments, any of the film processing steps disclosed is also performed on an underlayer formed on the substrate, and the term "substrate surface" is intended to include such underlayer as the context indicates. Thus, for example, where a film/layer or partial film/layer has been deposited onto a substrate surface, the exposed surface of the newly deposited film/layer becomes the substrate surface.

The term "wafer" and "substrate" will be used interchangeably in the instant disclosure. Thus, as used herein, a wafer serves as the substrate for the formation of the LED devices described herein.

Methods of depositing thin films include but are not limited to sputter deposition, atomic layer deposition (ALD), chemical vapor deposition (CVD), physical vapor deposition (PVD), plasma enhanced atomic layer deposition (PEALD), plasma enhanced chemical vapor deposition (PECVD), and combinations thereof.

Reference to LED refers to a light emitting diode that emits light when current flows through it. In one or more embodiments, for example, head lamps, the LEDs herein have one or more characteristic dimensions (e.g., height, width, etc.) in a range of greater than or equal to 1 micrometer to less than or equal to 300 micrometers, and all values and subranges therebetween. In one or embodiments, one or more dimensions of height and width have values in a range of 40 to 300 micrometers. Reference herein to micrometers allows for variation of ±1-5%. In some instances, the LEDs are referred to as micro-LEDs (uLEDs or μLEDs), referring to a light emitting diode having one or more characteristic dimensions (e.g., height, width, etc.) on the order of micrometers or tens of micrometers.

An LED can be combined with a "phosphor" to produce light with increased longer wavelength components. A phosphor, as used herein, refers to a material that converts or modifies the spectral power distribution of the LED. For example, an LED exhibiting a blue spectral range can be converted using a phosphor to convert the shorter wavelength blue light into longer wavelength (e.g., green or red wavelengths) to change the overall observed color. A phosphor absorbs some of the light from the LED causing electrons to be promoted to unstable energy levels. When the excited state electrons relax to the ground state, energy in the form of light is emitted. The emitted light has a lower energy (longer wavelength) than the light initially absorbed by the phosphor. A phosphor may also be referred to as a wavelength modifying component or composition.

The amount of light absorbed and emitted by the phosphor depends on, inter alia, the composition of the phosphor material and/or the concentration of phosphor material. The devices can be constructed so that all of the light emitted by the LED is absorbed by the phosphor material. The device, therefore, can be configured to emit light in a narrow range of wavelengths. A device could alternatively be configured to absorb less than all of the light from the LED so that the emitted light is a mixture of wavelengths from the LED and from the phosphor. By changing the concentration and/or phosphor material species, the color of the light can be tuned.

Color tuning with phosphor-converted LEDs is an effective approach to achieving high efficacy and flux of white light over a wide correlated color temperature (CCT) range while also providing high color fidelity.

Converter layers, namely phosphor layers absorb energy, converting an entering wavelength to a lower-energy higher wavelength. Herein, in one or more aspects, the converter layers comprise phosphor particles as down-converter material. Other down-converter materials may be semiconductor nanoparticles (quantum dots), which may be used in combination with phosphor particles.

Examples of different light illumination systems and/or light emitting diode (LED) implementations will be described more fully hereinafter with reference to the accompanying drawings. These examples are not mutually exclusive, and features found in one example may be combined with features found in one or more other examples to achieve additional implementations. Accordingly, it will be understood that the examples shown in the accompanying drawings are provided for illustrative purposes only and they are not intended to limit the disclosure in any way. Like numbers refer to like elements throughout.

Semiconductor light emitting devices or optical power emitting devices, such as devices that emit ultraviolet (UV) or infrared (IR) optical power, are among the most efficient light sources currently available. These devices may include light emitting diodes, resonant cavity light emitting diodes, vertical cavity laser diodes, edge emitting lasers, or the like (hereinafter referred to as "LEDs"). Due to their compact size and lower power requirements, for example, LEDs may be attractive candidates for many different applications. For example, they may be used as light sources (e.g., flashlights and camera flashes) for hand-held battery-powered devices, such as cameras and cell phones. They may also be used, for example, for automotive lighting, heads up display (HUD) lighting, horticultural lighting, street lighting, torch for video, general illumination (e.g., home, shop, office and studio lighting, theater/stage lighting and architectural lighting), augmented reality (AR) lighting, virtual reality (VR) lighting, as back lights for displays, and IR spectroscopy. Multi-junction devices or arrays of LEDs (such as monolithic LED arrays, micro-LED arrays, etc.) may be used for applications where more brightness is desired or required.

The present disclosure generally relates to the manufacture of cascade LED structures having two p-n junctions with different emission wavelengths in the blue range (400 nm to 500 nm) to create a desired emission spectrum for a phosphor-converted LED. In some embodiments, the cascade LED structure may be used in directional lighting applications, human-centric lighting applications, and in circadian lighting applications.

Embodiments described herein describe LED devices and methods for forming LED devices. In particular, the present disclosure describes LED devices, e.g., thin film flip chip (TFFC), patterned sapphire substrate flip chip (PSS-FC), vertical thin film (VTF), or lateral die, and methods to produce LED devices which are comprised of a first and a second p-n junction deposited sequentially on the same wafer and a tunnel junction separating the first p-n junction from the second p-n junction. Contacts are provided to the n-layer of the first p-n junction and the p-layer of the second p-n junction such that injected current flows through both p-n junctions. A phosphor element comprising at least one phosphor material is provided on the die for down-conversion to longer wavelengths.

As used herein, the term "p-n junction" refers to a boundary between two semiconductor layers of opposite conductivity types p-type and n-type. The "p" side contains an excess of holes, while the "n" side contains an excess of electrons. The excesses of holes and electrons may be obtained by intentional doping with acceptor or donor impurities, respectively, and/or may result from the presence of native crystal defects. Said boundary is not necessarily abrupt, planar, or smooth. Said boundary may include gradients in impurity concentration and/or layers of intrinsic (neutral) conductivity type between the p-type and n-type layers.

In one or more embodiments, the two p-n junctions and respective multiple quantum well (MQW) structures are designed for their respective target emission wavelengths by material composition and layer structure. In one or more embodiments, the peak emission wavelengths of the two p-n junctions are both between 400 and 500 nm and are at least 5 nm apart.

As used herein, the term "quantum well" refers to a nanometer-thin layer which can confine (quasi-) particles (typically electrons or holes) in the dimension perpendicular to the layer surface, whereas the movement in the other dimensions is not restricted. The confinement is a quantum effect and has effects on the density of states for the confined particles. As used herein, the term "multiple quantum well (MQW)" refers to periodic structures made of repeated quantum wells that have barriers that are too thick for adjacent wave functions to couple.

In one or more embodiments, one p-n junction has a peak emission wavelength in a range of from between 420 nm and 460 nm, and the other p-n junction has a peak emission wavelength in a range of from between 460 nm and 500 nm. Such an embodiment could be used, for example, to create high color fidelity or to increase melanopic content.

In another embodiment, one p-n junction has a peak emission wavelength in a range of from between 420 nm and 460 nm, and the other p-n junction has a peak emission wavelength in a range of from between 400 nm and 420 nm. Such an embodiment could be used, for example, to add violet light to a white spectrum to excite fluorescent whiteners in illuminated objects.

In still further embodiments, more than two p-n junctions may be stacked. For example, in one or more embodiments, a third p-n junction is formed on the second p-n junction. The second p-n junction and the third p-n junction being separated by a second tunnel junction. The emission wavelength of the third p-n junction is different from the emission wavelength of the first p-n junction and from the emission wavelength of the second p-n junction by at least 5 nm In one or more embodiments, a three-junction LED is formed having one p-n junction having a peak emission wavelength in a range of from between 400 nm and 420 nm, a second p-n junction having a peak emission wavelength in a range of from between 420 nm and 460 nm, and a third p-n junction having a peak emission wavelength in a range of from between 460 nm and 500 nm.

In one or more embodiments, the LED die and phosphor are integrated in a package. The package may include a ceramic submount for effective heat dissipation at high drive current. The package may include a dome for enhanced light extraction, or it may be implemented as a chip-scale package.

In one or more embodiments, the spectrum from the LED includes two emission peaks from the two p-n junctions and the emission spectrum of the wavelength converting layer, e.g., phosphor. The combined spectrum is generally affected by re-absorption, which has to be taken into account when designing the overall spectrum. There is limited ability to change the power ratio between the two blue emission peaks from the p-n junction since the same current flows through both junctions. The ratio may, however, be influenced to some extent by the respective quantum well design. Furthermore, the ratio may be changed by selecting phosphors with different absorption spectra.

In one or more embodiments, the spectrum is designed to have high color fidelity, characterized by, for example, color rendering index (CRI) $R_a \geq 90$ or TM-30 $R_f \geq 90$. In some embodiments, the coloring rendering index has an $R_a$ of 90, 91 92, 93, 94, 95, 96, 97, 98, or 99. In some embodiments, the coloring rendering index has a TM-30 $R_f$ of 90, 91, 92, 93, 94, 95, 96, 97 98, or 99.

In one or more embodiments, the spectrum is designed to have high melanopic content. This may be characterized by melanopic daylight efficacy ratio (MDER) greater than that of a reference illuminant (Planckian or daylight illuminant) of the same correlated color temperature (CCT). Conventional phosphor converted white LEDs generally have MDER lower than that of a reference illuminant of the same CCT.

The embodiments of the disclosure are described by way of the Figures, which illustrate devices and processes for forming devices in accordance with one or more embodiments of the disclosure. The processes shown are merely illustrative possible uses for the disclosed processes, and the skilled artisan will recognize that the disclosed processes are not limited to the illustrated applications.

Figure 1B:
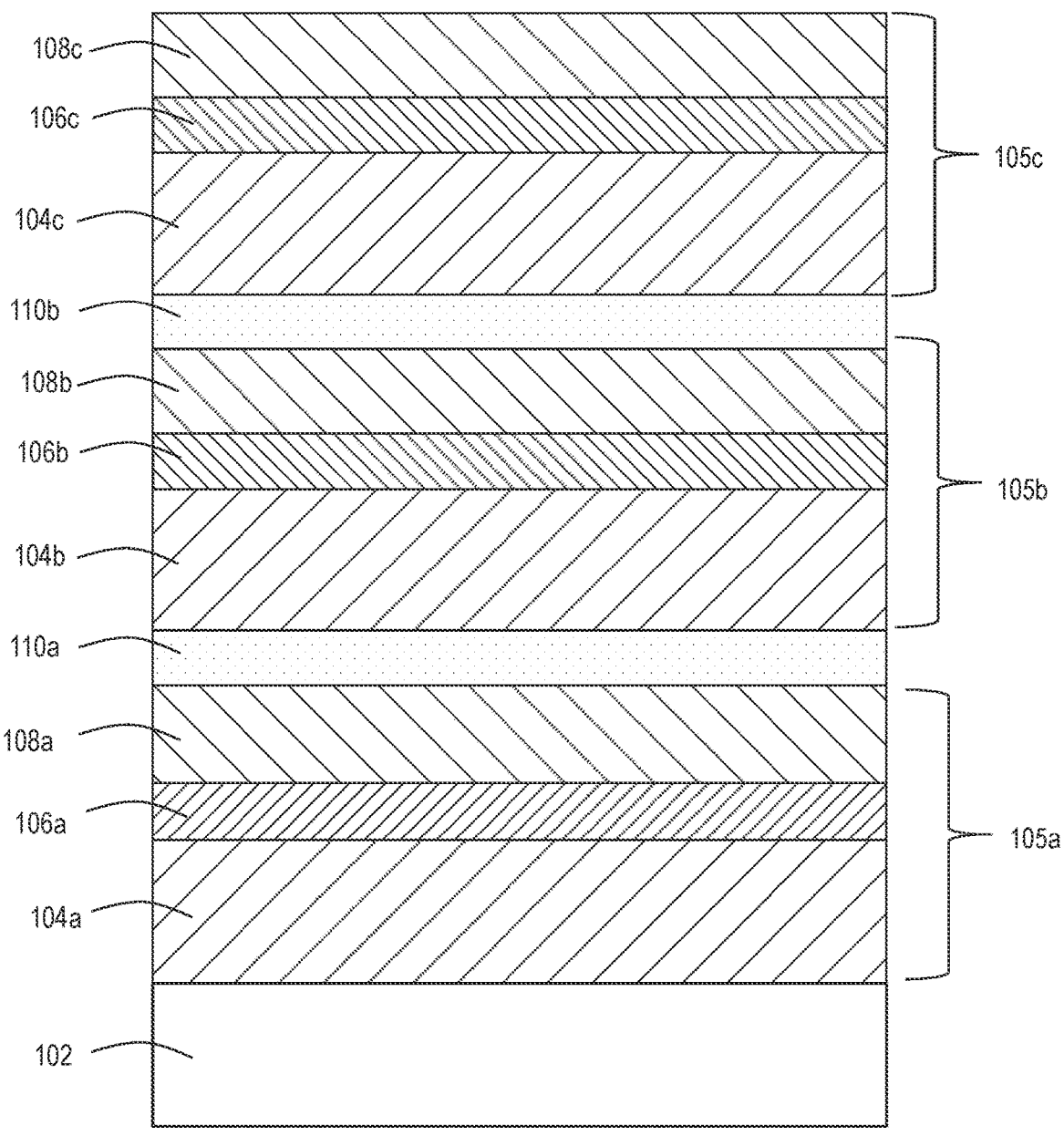
FIG. 1B illustrates a cross-section schematic of an epitaxy configuration according to one or more embodiments.

One or more embodiments of the disclosure are described with reference to the Figures. FIG. 1A illustrates a cross-sectional schematic of an epitaxy configuration 100A according to one or more embodiments. FIG. 1B illustrate a cross-sectional view of an epitaxy configuration 100B according to one or more embodiments.

Referring to FIG. 1A, an LED wafer 100A is manufactured by forming a plurality of III-nitride layers on a substrate 102 to form two p-n junctions on the substrate. The two p-n junctions are connected in series. With reference to FIG. 1B, an LED wafer 100B is manufactured by forming a plurality of III-nitride layers on a substrate 102 to form three p-n junctions on the substrate.

According to certain specific embodiments, the LED wafer 100A/100B comprises a first light emitting stack or first p-n junction 105a having a first n-type layer 104a formed on the substrate 102, a first multiple quantum well 106a grown on the first n-type layer 104a, a first p-type layer 108a formed on the first multiple quantum well 106a, and a first tunnel junction 110a formed on the first p-type layer 108a.

In the embodiment shown, there is a first tunnel junction 110a on the first p-n junction 105a, in particular on the first p-type layer 108a. A tunnel junction is a structure that allows electrons to tunnel from the valence band of a p-type layer to the conduction band of an n-type layer in reverse bias. When an electron tunnels, a hole is left behind in the p-type layer, such that carriers are generated in both regions. Accordingly, in an electronic device like a diode, where only a small leakage current flows in reverse bias, a large current can be carried in reverse bias across a tunnel junction. A tunnel junction comprises a particular alignment of the conduction and valence bands at the p/n tunnel junction. This can be achieved by using very high doping (e.g., in the p++/n++ junction). In addition, III-nitride materials have an inherent polarization that creates an electric field at hetero-interfaces between different alloy compositions. In some circumstances, this polarization field can also be utilized to achieve band alignment for tunneling.

Still referring to FIG. 1A and FIG. 1B, the LED wafer 100 further comprises a second light emitting stack or second p-n junction 105b on the first light emitting stack or first p-n junction 105a. The second light emitting stack or second p-n junction 105b includes a second n-type layer 104b on the first tunnel junction 110a, a second multiple quantum well 106b grown on a second n-type layer 104b, and a second p-type layer 108b on the second multiple quantum well 106b.

In one or more embodiments, a nucleation layer (not illustrated) and dislocation density control layers (not illustrated) may be grown on a suitable substrate 102, such as patterned or non-patterned sapphire. In one or more embodiments, the nucleation layer comprises a III-nitride material. In specific embodiments, the nucleation layer comprises gallium nitride (GaN) or aluminum nitride (AlN).

In one or more embodiments, first n-type layer 104a is grown on the substrate 102, the nucleation layer, and/or the dislocation density control layers. In one or more embodiments, a first n-type layer 104a is formed on the substrate 102. The substrate 102 may be any substrate known to one of skill in the art which is configured for use in the formation of LED devices. In one or more embodiments, the substrate 102 comprises one or more of sapphire, silicon carbide, silicon (Si), quartz, magnesium oxide (MgO), zinc oxide (ZnO), spinel, and the like. In one or more embodiments, the substrate 102 is a transparent substrate. In specific embodiments, the substrate 102 comprises sapphire. In one or more embodiments, the substrate 102 is not patterned prior to formation of the LEDs. Thus, in some embodiments, the substrate is 102 not patterned and can be considered to be flat or substantially flat. In other embodiments, the substrate 102 is a patterned substrate.

In one or more embodiments, the first n-type layer 104a and the second n-type layer 104b may comprise any Group III-V semiconductors, including binary, ternary, and quaternary alloys of gallium (Ga), aluminum (Al), indium (In), and nitrogen (N), also referred to as III-nitride materials. Thus, in some embodiments, the first n-type layer 104a and the second n-type layer 104b independently comprise one or more of gallium nitride (GaN), aluminum nitride (AlN), indium nitride (InN), gallium aluminum nitride (GaAlN), gallium indium nitride (GaInN), aluminum gallium nitride (AlGaN), aluminum indium nitride (AlInN), indium gallium nitride (InGaN), indium aluminum nitride (InAlN), and the like. In a specific embodiment, the first n-type layer 104a and the second n-type layer 104b comprise gallium nitride (GaN). In one or more embodiments, the first n-type layer 104a and the second n-type layer 104b are independently doped with n-type dopants, such as silicon (Si) or germanium (Ge). In one or more embodiments, the dopant concentration is in a range of from 1 e17 to 2e19 cm³. In one or more embodiments, the first n-type layer 104a may have a thickness in the range of from 1 μm to 3 μm to ensure a wide process margin for a subsequent etching step used to contact this layer.

In one or more embodiments, the layers of III-nitride material may be deposited by one or more of sputter deposition, atomic layer deposition (ALD), metalorganic chemical vapor deposition (MOCVD), physical vapor deposition (PVD), plasma enhanced atomic layer deposition (PEALD), and plasma enhanced chemical vapor deposition (PECVD).

"Sputter deposition" as used herein refers to a physical vapor deposition (PVD) method of thin film deposition by sputtering. In sputter deposition, a material, e.g., a III-nitride, is ejected from a target that is a source onto a substrate. The technique is based on ion bombardment of a source material, the target. Ion bombardment results in a vapor due to a purely physical process, i.e., the sputtering of the target material.

As used according to some embodiments herein, "atomic layer deposition" (ALD) or "cyclical deposition" refers to a vapor phase technique used to deposit thin films on a substrate surface. The process of ALD involves the surface of a substrate, or a portion of substrate, being exposed to alternating precursors, i.e., two or more reactive compounds, to deposit a layer of material on the substrate surface. When the substrate is exposed to the alternating precursors, the precursors are introduced sequentially or simultaneously. The precursors are introduced into a reaction zone of a processing chamber, and the substrate, or portion of the substrate, is exposed separately to the precursors.

As used herein according to some embodiments, "chemical vapor deposition" refers to a process in which films of materials are deposited from the vapor phase by decomposition of chemicals on a substrate surface. In CVD, a substrate surface is exposed to precursors and/or co-reagents simultaneously or substantially simultaneously. A particular subset of CVD processes commonly used in LED manufacturing use metalorganic precursor chemical and are referred to as MOCVD or metalorganic vapor phase epitaxy (MOVPE). As used herein, "substantially simultaneously" refers to either co-flow or where there is overlap for a majority of exposures of the precursors.

As used herein according to some embodiments, "plasma enhanced atomic layer deposition (PEALD)" refers to a technique for depositing thin films on a substrate. In some examples of PEALD processes relative to thermal ALD processes, a material may be formed from the same chemical precursors, but at a higher deposition rate and a lower temperature. In a PEALD process, in general, a reactant gas and a reactant plasma are sequentially introduced into a process chamber having a substrate in the chamber. The first reactant gas is pulsed in the process chamber and is adsorbed onto the substrate surface. Thereafter, the reactant plasma is pulsed into the process chamber and reacts with the first reactant gas to form a deposition material, e.g., a thin film on a substrate. Similar to a thermal ALD process, a purge step may be conducted between the deliveries of each of the reactants.

As used herein according to one or more embodiments, "plasma enhanced chemical vapor deposition (PECVD)" refers to a technique for depositing thin films on a substrate. In a PECVD process, a source material, which is in gas or liquid phase, such as a gas-phase III-nitride material or a vapor of a liquid-phase III-nitride material that have been entrained in a carrier gas, is introduced into a PECVD chamber. A plasma-initiated gas is also introduced into the chamber. The creation of plasma in the chamber creates excited radicals. The excited radicals are chemically bound to the surface of a substrate positioned in the chamber, forming the desired film thereon.

In one or more embodiments, phosphor converted light emitting diode device 100A and phosphor converted light emitting diode device 100B may be manufactured by placing the substrate 102 in a metalorganic vapor-phase epitaxy (MOVPE) reactor so that the phosphor converted light emitting diode device layers are grown epitaxially.

In one or more embodiments, after the growth of the first n-type layer 104a, a first multiple quantum well 106a is grown. The first multiple quantum well 106a consists of multiple quantum wells and may include electron blocking layer(s) grown after the quantum wells and strain-control layers grown before the quantum wells. The process of growing the strain-control layers may generate V-pit defects before the growth of the first quantum well. The number of quantum wells typically used for blue LEDs ranges from 3 to 15, the typical barrier thickness ranges from 5 nm to 25 nm, the well thickness ranges from 1 nm to 5 nm, and the well indium concentration ranges from 15% indium to 25% indium. In some embodiments, the quantum wells may be doped with Si or Ge, while in other embodiments, the quantum wells are undoped. After the first multiple quantum well 106a is grown, a first p-type layer 108a is grown on the first multiple quantum well 106a.

In one or more embodiments, the first p-type layer 108a and the second p-type layer 108b may independently comprise any Group III-V semiconductors, including binary, ternary, and quaternary alloys of gallium (Ga), aluminum (Al), indium (In), and nitrogen (N), also referred to as III-nitride materials. Thus, in some embodiments, the first p-type layer 108a and the second p-type layer 108b independently comprise one or more of gallium nitride (GaN), aluminum nitride (AlN), indium nitride (InN), gallium aluminum nitride (GaAlN), gallium indium nitride (GaInN), aluminum gallium nitride (AlGaN), aluminum indium nitride (AlInN), indium gallium nitride (InGaN), indium aluminum nitride (InAlN), and the like. In one or more embodiments, magnesium (Mg) is the acceptor dopant for the first p-type layer 108a.

In one or more embodiments, a first tunnel junction 110a is then grown on the first p-type layer 108a, comprised of heavily doped p-GaN and n-GaN layers with doping concentrations in the range $10^{19}$-$10^{21}$ cm$^{-3}$ and layer thickness typically less than 50 nm. The first tunnel junction 110a may also utilize thin InGaN or graded InGaN layers disposed between highly doped GaN layers.

In some embodiments, the first p-type layer 108a and the second p-type layer 108b independently comprise a sequence of doped p-type layers. In one or more embodiments, the first p-type layer 108a and the second p-type layer 108b independently comprise a gallium nitride (GaN) layer. The first p-type layer 108a and the second p-type layer 108b may be independently doped with any suitable p-type dopant known to the skilled artisan. In one or more embodiments, the first p-type layer 108a and the second p-type layer 108b may independently be doped with magnesium (Mg). In one or more embodiments, the first p-type layer 108a and the second p-type layer 108b independently comprise a first magnesium doped p-type aluminum gallium nitride layer, a magnesium doped p-type gallium nitride layer, and a second magnesium doped p-type aluminum gallium nitride layer.

In one or more embodiments, a second n-type layer 104b is grown on the tunnel junction 110a. To ensure an even current distribution within the device, it may be advantageous to match the sheet resistance of the first and second n-type layers 104a, 104b, however, non-matching implementations are possible with differences in spacings of first and second sets of contact vias to be discussed below. In one or more embodiments, the second n-type layer 104b has a thickness of at least 100 nm in order to be able to subsequently place an etched contact within this layer.

In one or more embodiments, after the second n-type layer 104b is grown on the first tunnel junction 110a, a second multiple quantum well 106b is grown on the second n-type layer 104b. The general range of parameter limits is the same for the second multiple quantum well 106b as for the first multiple quantum well 106a.

In one or more embodiments, the epitaxy ends with growth of a second p-type layer 108b on the second multiple quantum well 106b.

In one or more embodiments, the peak emission wavelengths of the first p-n junction 105a and the second p-n junction 105b are both between 400 and 500 nm and are at least 5 nm apart.

In one or more embodiments, one p-n junction has a peak emission wavelength in a range of from between 420 nm and 460 nm, and the other p-n junction has a peak emission wavelength in a range of from between 460 nm and 500 nm. In some embodiments, the first p-n junction 105a has a peak emission wavelength in a range of from between 420 nm and 460 nm, and the second p-n junction has a peak emission wavelength in a range of from between 460 nm and 500 nm. In other embodiments, the second p-n junction 105b has a peak emission wavelength in a range of from between 420 nm and 460 nm, and the first p-n junction has a peak emission wavelength in a range of from between 460 nm and 500 nm.

In another embodiment, one p-n junction has a peak emission wavelength in a range of from between 420 nm and 460 nm, and the other p-n junction has a peak emission wavelength in a range of from between 400 nm and 420 nm. In one or more embodiments, for example, the first p-n junction 105a has a peak emission wavelength in a range of from between 420 nm and 460 nm, and the second p-n junction 105b has a peak emission wavelength in a range of from between 400 nm and 420 nm. In other embodiments, the second p-n junction 105b has a peak emission wavelength in a range of from between 420 nm and 460 nm, and the first p-n junction 105a has a peak emission wavelength in a range of from between 400 nm and 420 nm.

With reference to FIG. 1B, in one or more embodiments, more than two p-n junctions may be stacked. For example, in one or more embodiments, a third light emitting stack or a third p-n junction 105c is formed on the second p-n junction 105b. In one or more embodiments, the second p-n junction 105b and the third p-n junction 105c are separated by a second tunnel junction 110b. In one or more embodiments, the third p-n junction 105c includes a third n-type layer 104c in contact with the second tunnel junction 110b and on a third multiple quantum well 106c, the third multiple quantum well 106c on a third p-type layer 108c.

In one or more embodiments, the emission wavelength of the third p-n junction 105c is different from the emission wavelength of the first p-n junction 105a and from the emission wavelength of the second p-n junction 105b by at least 5 nm.

In one or more embodiments, a three-junction LED 100B is formed having one p-n junction having a peak emission wavelength in a range of from between 400 nm and 420 nm, a second p-n junction having a peak emission wavelength in a range of from between 420 nm and 460 nm, and a third p-n junction having a peak emission wavelength in a range of from between 460 nm and 500 nm. As recognized by one of skill in the art, any combination of these wavelengths is possible. For example, in some embodiments, the first p-n junction 105a has a peak emission wavelength in a range of from between 400 nm and 420 nm, the second p-n junction 105b has a peak emission wavelength in a range of from between 420 nm and 460 nm, and the third p-n junction 105c has a peak emission wavelength in a range of from between 460 nm and 500 nm. In other embodiments, the second p-n junction 105b has a peak emission wavelength in a range of from between 400 nm and 420 nm, the third p-n junction 105c has a peak emission wavelength in a range of from between 420 nm and 460 nm, and the first p-n junction 105a has a peak emission wavelength in a range of from between 460 nm and 500 nm.

In one or more embodiments, the third n-type layer 104c may comprise any of the materials described above with reference to the first n-type layer 104a and the second n-type layer 104b. The third p-type layer 108c may comprise any of the materials described above with reference to the first p-type layer 108a and the second p-type layer 108c. Further, the third multiple quantum well 106c may comprise any of the materials described above with reference to the first multiple quantum well 106a and the second multiple quantum well 106b.

Figure 2:
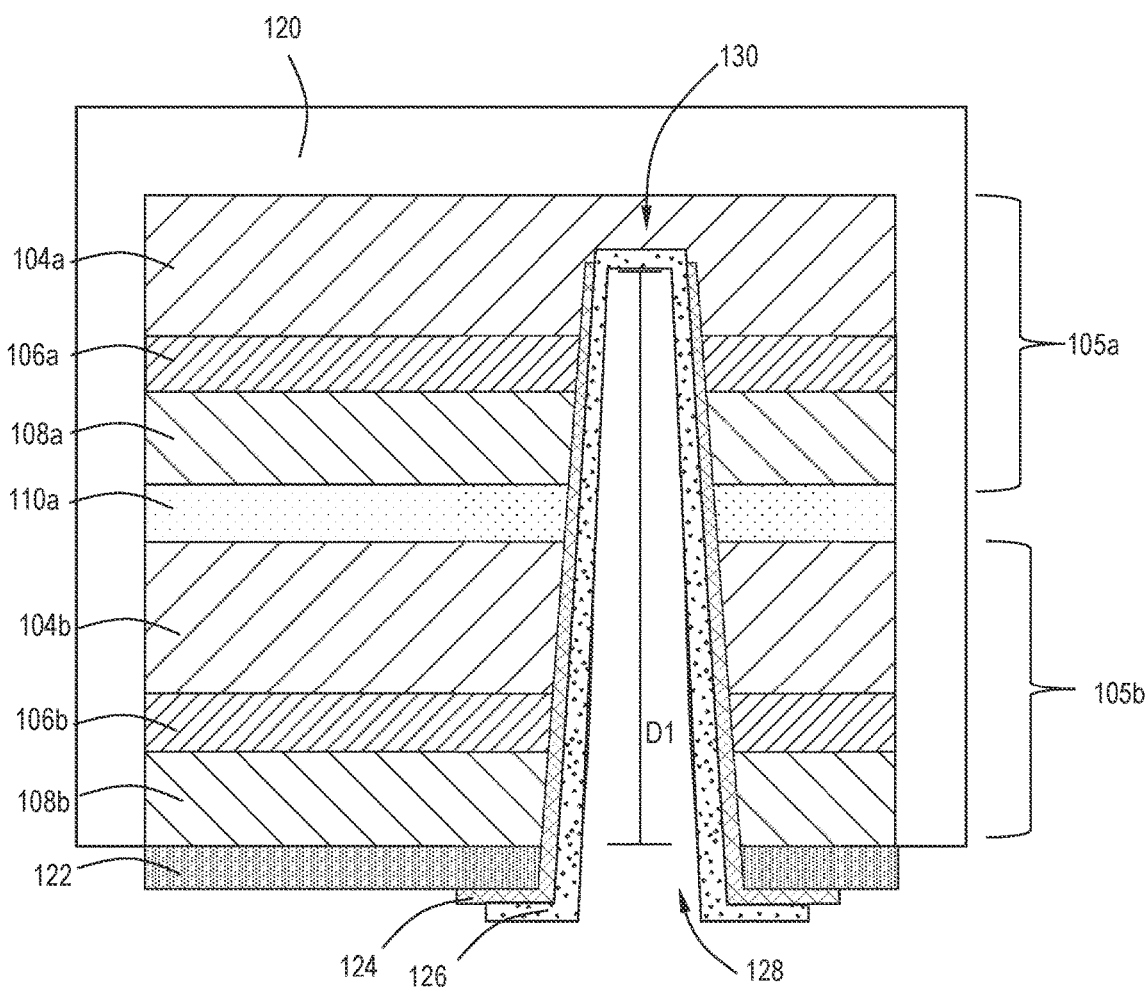
FIG. 2 illustrates a cross-section schematic of the epitaxy configuration of FIG. 1 after processing into a thin film flip chip (TFFC) device according to one or more embodiments.

FIG. 2 illustrates a cross-section schematic after processing the epitaxy stack 100 of FIG. 1 into a thin film flip chip (TFFC) die design.

After epitaxial growth, the wafer is processed through the fabrication steps below resulting in an LED die that appears in cross-section as shown in FIG. 2. For growth on a patterned sapphire substrate, the final step on the list may be omitted. Referring to FIG. 2, a via 130 is dry etched to form the TFFC die design 150. A single via is shown for illustrative purposes, but, generally, the device may compromise multiple vias for optimal current spreading.

In one or more embodiments, the epitaxy stack of FIG. 1 is first subjected to an acceptor activation anneal. In some embodiments, it is preferable to do the acceptor activation anneal after dry etching in order to allow for hydrogen to escape buried p-type layers through the via side walls.

In one or more embodiments, a conformal dielectric layer 124 may be deposited in the via 130. As used herein, the term "dielectric" refers to an electrical insulator material that can be polarized by an applied electric field. In one or more embodiments, the dielectric layer includes, but is not limited to, oxides, e.g., silicon oxide ($SiO_2$), aluminum oxide ($Al_2O_3$), nitrides, e.g., silicon nitride ($Si_3N_4$). In one or more embodiments, the dielectric layer may comprise silicon nitride ($Si_3N_4$), silicon oxide ($SiO_2$), or a multi-layer of silicon dioxide ($SiO_2$) and silicon nitride ($Si_3N_4$). In some embodiments, the dielectric layer composition is non-stoichiometric relative to the ideal molecular formula. For example, in some embodiments, the dielectric layer includes, but is not limited to, oxides (e.g., silicon oxide, aluminum oxide), nitrides (e.g., silicon nitride (SiN)), oxycarbides (e.g., silicon oxycarbide (SiOC)), and oxynitrocarbides (e.g., silicon oxycarbonitride (SiNCO)).

Still referring to FIG. 2, form contact openings 128 are formed. A cathode metal layer 126 is deposited in a contact opening 128 in the via 130 along the sidewalls of the via 130 on the dielectric layer 124. The cathode metal layer 126 may comprise any suitable material known to the skilled artisan. In one or more embodiments, the cathode metal layer 126 is any high reflectivity metal that makes ohmic contact with the n-type layers. In one or more specific embodiments, the cathode metal layer 126 comprises an n-contact material selected from one or more of silver (Ag) and aluminum (Al).

In one or more embodiments, an anode metal layer 122 is deposited along the first n-type layer 104a. The anode metal layer 122 may comprise any suitable material known to the skilled artisan. In one or more embodiments, the anode metal layer 122 is any high reflectivity metal that makes ohmic contact with the n-type layers. In one or more specific embodiments, the anode metal layer 122 comprises a p-contact material selected from one or more of silver (Ag) and aluminum (Al).

With reference to FIG. 2, in one or more embodiments, the die is singulated. The die is then bonded to a sub-mount using a technique such as gold-gold interconnect bonding. The final step is an optional laser lift-off step, optionally followed by photoelectrochemical etching to texture the surface. In one or more embodiments, after laser lift-off, a wavelength converting layer 120, more specifically a phosphor, is deposited on the first p-n junction 105*a* and on the second p-n junction 105*b* to form a phosphor-converted LED.

Figure 3:
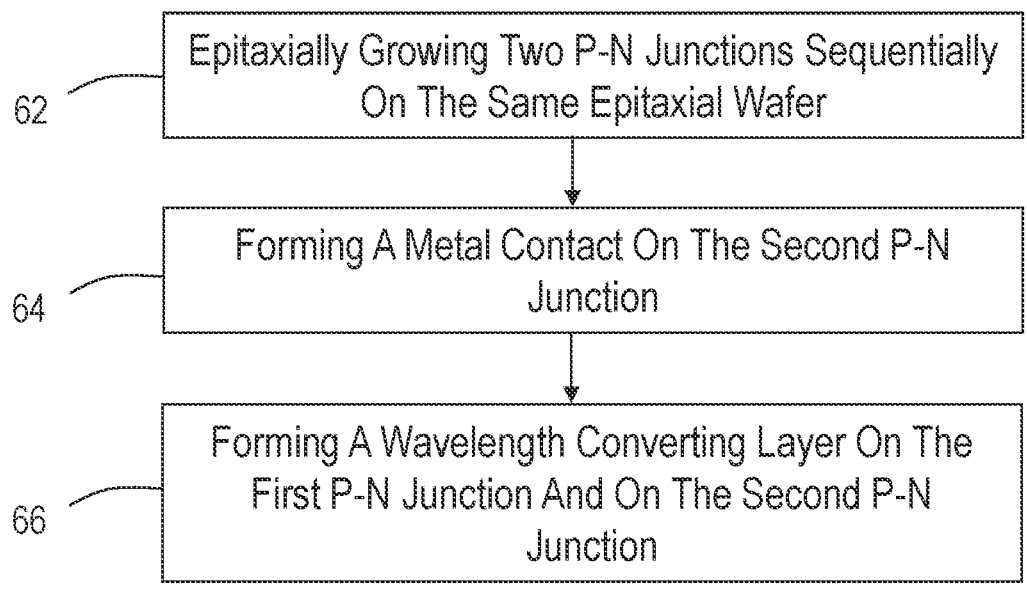
FIG. 3 illustrates a process flow diagram for a method of forming a phosphor converted LED die according to one or more embodiments.

FIG. 3 illustrates a process flow diagram for a method 60 of manufacturing an LED die according to one or more embodiments. In the method, at operation 62, two p-n junctions are epitaxially and sequentially grown on the same epitaxial wafer. At operation 64, a metal contact is formed on the second p-n junction. At operation 66, a wavelength converting layer is formed on the first p-n junction and on the second p-n junction.

Figure 4:
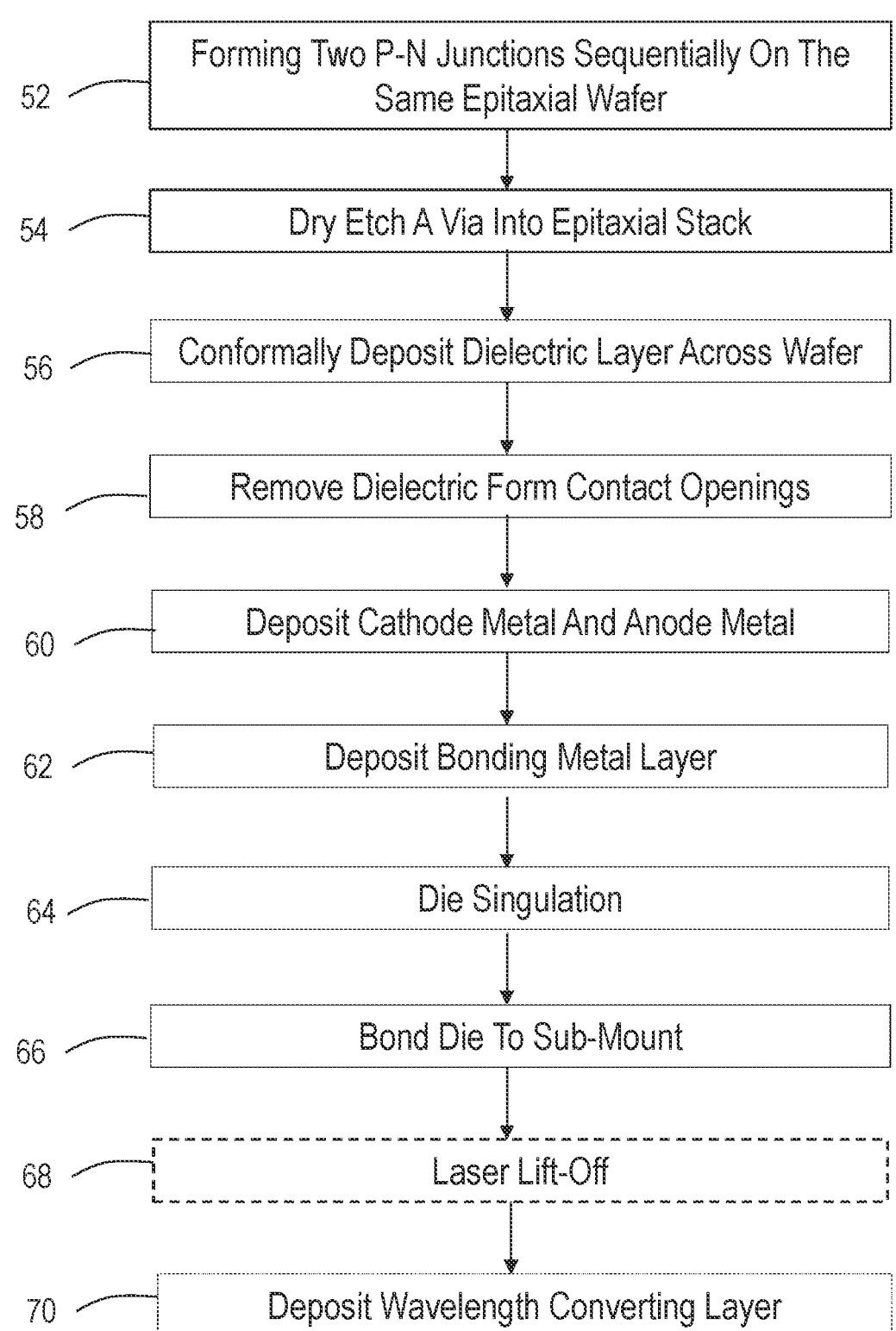
FIG. 4 illustrates a process flow diagram for a method of forming a thin film flip chip (TFFC) device according to one or more embodiments.

FIG. 4 illustrates a process flow diagram of a method 50 of manufacturing a thin film flip chip (TFFC) die design according to one or more embodiments of the present disclosure. With reference to FIG. 4, in one or more embodiments, the method begins at operation 52 by forming two p-n junctions sequentially on the same epitaxial wafer to form an epitaxial stack, the epitaxial stack including at least one n-type layer and at least one p-type layer and having a tunnel junction separating the first p-n junction from the second p-n junction. At operation 54 a via is dry etched into the epitaxial stack. At operation 56, a dielectric layer is conformally deposited in the via. At operation 58, a portion of the dielectric layer is removed to form a contact openings in the via, the contact openings exposing the at least one n-type layer. At operation 60, a cathode metal and an anode metal are deposited in the via on the dielectric layer. At operation 62, a bonding metal layer is deposited. At operation 64, die singulation occurs. At operation 66, the die is bonded to a sub-mount. At operation 68, laser lift-off optionally occurs.

EMBODIMENTS

Various embodiments are listed below. It will be understood that the embodiments listed below may be combined with all aspects and other embodiments in accordance with the scope of the invention.

Embodiment (a). A light-emitting diode (LED) comprising: a first p-n junction on a second p-n junction, the first p-n junction and the second p-n junction separated by a tunnel junction, wherein the first p-n junction comprises a first p-type layer on a first multiple quantum well, and the first multiple quantum well on a first n-type layer, the second p-n junction comprises a second n-type layer in contact with the tunnel junction and on a second multiple quantum well, the second multiple quantum well on a second p-type layer; a first metal contact on the first n-type layer; a second metal contact on the second p-type layer; and a wavelength converting layer on the first p-n junction and on the second p-n junction.

Embodiment (b). The LED die of embodiment (a), wherein the first p-n junction has a first emission wavelength in a range of from 400 nm to 500 nm and wherein the second p-n junction has a second emission wavelength in a range of from 400 nm to 500 nm, the first emission wavelength different from the second emission wavelength by at least 5 nm.

Embodiment (c). The LED die of embodiment (a) to (b), wherein the first emission wavelength is in a range of from 420 nm and 460 nm and the second emission wavelength is in a range of from 460 nm and 500 nm.

Embodiment (d). The LED die of embodiment (a) to (c), wherein the first emission wavelength is in a range of from 420 nm and 460 nm and the second emission wavelength is in a range of from 400 nm and 420 nm.

Embodiment (e). The LED die of embodiment (a) to (d), further comprising a third p-n junction on the second p-n junction, the second p-n junction, the third p-n junction and the second p-n junction separated by a second tunnel junction, and the third p-n junction comprising a third n-type layer in contact with the second tunnel junction and on a third multiple quantum well, the third multiple quantum well on a third p-type layer.

Embodiment (f). The LED die of embodiment (a) to (e), wherein the third p-n junction has a third emission wavelength in a range of from 400 nm to 500 nm, and the third emission wavelength is different from the first emission wavelength and from the second emission wavelength by at least 5 nm.

Embodiment (g). The LED die of embodiment (a) to (f), wherein the first emission wavelength is in a range of from 400 nm and 420 nm, the second emission wavelength is in a range of from 420 nm and 460 nm, and the third emission wavelength is in a range of from 460 nm to 500 nm.

Embodiment (h). The LED die of embodiment (a) to (g), wherein the metal contact comprises one or more of a cathode layer or an anode layer.

Embodiment (i). The LED die of embodiment (a) to (h), wherein the wavelength converting layer comprises phosphor.

Embodiment (j). The LED die of embodiment (a) to (i), further comprising a sub-mount.

Embodiment (k). The LED die of embodiment (a) to (j), wherein the first n-type layer and the second n-type layer independently comprise one or more of gallium nitride (GaN), aluminum nitride (AlN), indium nitride (InN), gallium aluminum nitride (GaAlN), gallium indium nitride (GaInN), aluminum gallium nitride (AlGaN), aluminum indium nitride (AlInN), indium gallium nitride (InGaN), indium aluminum nitride (InAlN), and the like.

Embodiment (l). The LED die of embodiment (a) to (k), further comprising a dielectric layer on the LED die.

Embodiment (m). The LED die of embodiment (a) to (l), further comprising a bonding metal layer.

Embodiment (n). A method of manufacturing a light-emitting diode (LED) die, the method comprising: epitaxially growing a first p-n junction and a second p-n junction on an epitaxial wafer, the first p-n junction and the second p-n junction separated by a tunnel junction, the first p-n junction comprising a first p-type layer on a first multiple quantum well, and the first multiple quantum well on a first n-type layer, the second p-n junction comprising a second n-type layer in contact with the tunnel junction and on a second multiple quantum well, the second multiple quantum well on a second p-type layer; forming a wavelength converting layer on the first p-n junction and on the second p-n junction; and forming at least one metal contact on one or more of the first n-type layer or the second p-type layer, wherein the first p-n junction has a first emission wavelength in a range of from 400 nm to 500 nm and wherein the second p-n junction has a second emission wavelength in a range of from 400 nm to 500 nm, the first emission wavelength different from the second emission wavelength by at least 5 nm.

Embodiment (o). The method of embodiment (n), wherein the metal contact comprises one or more of a cathode layer or an anode layer.

Embodiment (p). The method of embodiment (n) to (o), further comprising mounting the LED die to a sub-mount.

Embodiment (q). The method of embodiment (n) to (p), further comprising forming a dielectric layer on the LED die.

Embodiment (r). The method of embodiment (n) to (q), further comprising forming a bonding metal layer.

Embodiment(s). A method of manufacturing thin film flip chip (TFFC) die, the method comprising: sequentially forming a first p-n junction and a second p-n junction on an epitaxial wafer to form an epitaxial stack, the first p-n junction and the second p-n junction separated by a tunnel junction, the first p-n junction comprising a first p-type layer on a first multiple quantum well, and the first multiple quantum well on a first n-type layer, the second p-n junction comprising a second n-type layer in contact with the tunnel junction and on a second multiple quantum well, the second multiple quantum well on a second p-type layer; forming a wavelength converting layer on the first p-n junction and on the second p-n junction; dry etching the epitaxial stack to form a via; conformally depositing a dielectric layer in the via; removing a portion of the dielectric layer to form contact openings; depositing one or more of an anode layer and a cathode layer in the contact openings; depositing a bonding metal layer on one or more of the anode layer or the cathode layer; singulating the thin film flip chip (TFFC) die; and bonding the thin film flip chip (TFFC) die to a submount.

Embodiment (t). The method of embodiment(s), wherein the wavelength converting layer comprises phosphor.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to the terms first, second, third, etc. may be used herein to describe various elements, and these elements should not be limited by these terms. These terms may be used to distinguish one element from another.

Reference throughout this specification to a layer, region, or substrate as being "on" or extending "onto" another element, means that it may be directly on or extend directly onto the other element or intervening elements may also be present. When an element is referred to as being "directly on" or extending "directly onto" another element, there may be no intervening elements present. Furthermore, when an element is referred to as being "connected" or "coupled" to another element, it may be directly connected or coupled to the other element and/or connected or coupled to the other element via one or more intervening elements. When an element is referred to as being "directly connected" or "directly coupled" to another element, there are no intervening elements present between the element and the other element. It will be understood that these terms are intended to encompass different orientations of the element in addition to any orientation depicted in the figures.

Relative terms such as "below," "above," "upper,", "lower," "horizontal" or "vertical" may be used herein to describe a relationship of one element, layer, or region to another element, layer, or region as illustrated in the figures. It will be understood that these terms are intended to encompass different orientations of the device in addition to the orientation depicted in the figures.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A light-emitting diode (LED) die comprising:
a first p-n junction on a second p-n junction, the first p-n junction and the second p-n junction separated by a tunnel junction, wherein:
the first p-n junction comprises a first p-type layer on a first multiple quantum well, and the first multiple quantum well on a first n-type layer,
the second p-n junction comprises a second n-type layer in contact with the tunnel junction and on a second multiple quantum well, the second multiple quantum well on a second p-type layer;
a first metal contact on a dielectric layer;
a second metal contact on the second p-type layer; and
a wavelength converting layer surrounding the first p-n junction and the second p-n junction.

2. The LED die of claim 1, wherein the first p-n junction has a first emission wavelength in a range of from 400 nm to 500 nm and wherein the second p-n junction has a second emission wavelength in a range of from 400 nm to 500 nm, the first emission wavelength different from the second emission wavelength by at least 5 nm.

3. The LED die of claim 2, wherein the first emission wavelength is in a range of from 420 nm and 460 nm and the second emission wavelength is in a range of from 460 nm and 500 nm.

4. The LED die of claim 2, wherein the first emission wavelength is in a range of from 420 nm and 460 nm and the second emission wavelength is in a range of from 400 nm and 420 nm.

5. The LED die of claim 2, further comprising a third p-n junction on the second p-n junction, the second p-n junction, the third p-n junction and the second p-n junction separated by a second tunnel junction, and the third p-n junction comprising a third n-type layer in contact with the second tunnel junction and on a third multiple quantum well, the third multiple quantum well on a third p-type layer.

6. The LED die of claim 5, wherein the third p-n junction has a third emission wavelength in a range of from 400 nm to 500 nm, and the third emission wavelength is different from the first emission wavelength and from the second emission wavelength by at least 5 nm.

7. The LED die of claim 6, wherein the first emission wavelength is in a range of from 400 nm and 420 nm, the second emission wavelength is in a range of from 420 nm and 460 nm, and the third emission wavelength is in a range of from 460 nm to 500 nm.

8. The LED die of claim 1, wherein the metal contact comprises one or more of a cathode layer or an anode layer.

9. The LED die of claim 1, wherein the wavelength converting layer comprises phosphor.

10. The LED die of claim 1, further comprising a sub-mount.

11. The LED die of claim 1, wherein the first n-type layer and the second n-type layer independently comprise one or more of gallium nitride (GaN), aluminum nitride (AlN), indium nitride (InN), gallium aluminum nitride (GaAlN), gallium indium nitride (GaInN), aluminum gallium nitride (AlGaN), aluminum indium nitride (AlInN), indium gallium nitride (InGaN), indium aluminum nitride (InAlN), and the like.

12. The LED die of claim 1, further comprising a via extending from the first n-type layer of the first p-n junction to the second p-type layer of the second p-n junction.

13. The LED die of claim 1, further comprising a bonding metal layer.

14. A method of manufacturing a light-emitting diode (LED) die, the method comprising:

epitaxially growing a first p-n junction and a second p-n junction on an epitaxial wafer, the first p-n junction and the second p-n junction separated by a tunnel junction, the first p-n junction comprising a first p-type layer on a first multiple quantum well, and the first multiple quantum well on a first n-type layer, the second p-n junction comprising a second n-type layer in contact with the tunnel junction and on a second multiple quantum well, the second multiple quantum well on a second p-type layer;

forming a wavelength converting layer surrounding the first p-n junction and the second p-n junction; and forming at least one metal contact on one or more of the first n-type layer or the second p-type layer, wherein the first p-n junction has a first emission wavelength in a range of from 400 nm to 500 nm and wherein the second p-n junction has a second emission wavelength in a range of from 400 nm to 500 nm, the first emission wavelength different from the second emission wavelength by at least 5 nm.

15. The method of claim 14, wherein the metal contact comprises one or more of a cathode layer or an anode layer.

16. The method of claim 14, further comprising mounting the LED die to a sub-mount.

17. The method of claim 14, further comprising forming a dielectric layer on the LED die.

18. The method of claim 14, further comprising forming a bonding metal layer.

19. A method of manufacturing thin film flip chip (TFFC) die, the method comprising:

sequentially forming a first p-n junction and a second p-n junction on an epitaxial wafer to form an epitaxial stack, the first p-n junction and the second p-n junction separated by a tunnel junction, the first p-n junction comprising a first p-type layer on a first multiple quantum well, and the first multiple quantum well on a first n-type layer, the second p-n junction comprising a second n-type layer in contact with the tunnel junction and on a second multiple quantum well, the second multiple quantum well on a second p-type layer;

forming a wavelength converting layer surrounding the first p-n junction and the second p-n junction;

dry etching the epitaxial stack to form a via;

conformally depositing a dielectric layer in the via;

removing a portion of the dielectric layer to form contact openings;

depositing one or more of an anode layer and a cathode layer in the contact openings;

depositing a bonding metal layer on one or more of the anode layer or the cathode layer;

singulating the thin film flip chip (TFFC) die; and bonding the thin film flip chip (TFFC) die to a sub-mount.

20. The method of claim 19, wherein the wavelength converting layer comprises phosphor.

21. The LED die of claim 12, wherein the dielectric layer conformally lining the via and defining opposing sidewalls of the via.

22. The LED die of claim 21, wherein the first metal contact is along the sidewall of the via on the dielectric layer.

* * * * *